(12) United States Patent
Zhou

(10) Patent No.: US 12,022,740 B2
(45) Date of Patent: Jun. 25, 2024

(54) SEMICONDUCTOR STRUCTURE FORMATION METHOD

(71) Applicants: Semiconductor Manufacturing International (Shanghai) Corporation, Shanghai (CN); Semiconductor Manufacturing International (Beijing) Corporation, Beijing (CN)

(72) Inventor: Ming Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 18/135,964

(22) Filed: Apr. 18, 2023

(65) Prior Publication Data

US 2023/0255118 A1  Aug. 10, 2023

Related U.S. Application Data

(62) Division of application No. 17/033,776, filed on Sep. 26, 2020, now Pat. No. 11,665,972.

(30) Foreign Application Priority Data

Dec. 11, 2019 (CN) .......................... 201911267677.0

(51) Int. Cl.
*H10N 50/01* (2023.01)
*H10N 50/80* (2023.01)

(52) U.S. Cl.
CPC ............. *H10N 50/01* (2023.02); *H10N 50/80* (2023.02)

(58) Field of Classification Search
CPC ............................... H10N 50/01; H10N 50/80
See application file for complete search history.

(56) References Cited

U.S. PATENT DOCUMENTS

| | | | |
|---|---|---|---|
| 8,987,119 B2 | 3/2015 | Dunton et al. | |
| 2005/0191810 A1 | 9/2005 | Matsuda et al. | |
| 2008/0265347 A1* | 10/2008 | Iwayama | H10N 50/01 |
| | | | 257/E29.323 |
| 2010/0240189 A1* | 9/2010 | Jeong | H10N 70/231 |
| | | | 438/653 |
| 2011/0233663 A1* | 9/2011 | Hamada | H01L 29/66666 |
| | | | 257/E29.264 |
| 2014/0145302 A1* | 5/2014 | Hong | H01L 28/60 |
| | | | 257/532 |
| 2016/0190207 A1 | 6/2016 | Nam et al. | |
| 2017/0279036 A1* | 9/2017 | Mo | H10N 50/10 |
| 2018/0069174 A1* | 3/2018 | Annunziata | H01F 41/308 |
| 2018/0174845 A1* | 6/2018 | Jang | H01L 29/4966 |
| 2020/0083428 A1* | 3/2020 | Weng | H01F 41/34 |

* cited by examiner

*Primary Examiner* — Ali Naraghi
*Assistant Examiner* — Siangluai Mang
(74) *Attorney, Agent, or Firm* — Anova Law Group, PLLC

(57) ABSTRACT

A method for forming a semiconductor structure is provided. The method includes providing a substrate, where the substrate includes a conductive layer therein, and a surface of the substrate exposes a surface of the conductive layer; forming a groove adjacent to the conductive layer in the substrate, where the groove exposes a portion of a sidewall surface of the conductive layer; and forming a lower electrode layer in the groove and on a top surface of the conductive layer.

14 Claims, 5 Drawing Sheets

SEMICONDUCTOR STRUCTURE FORMATION METHOD

CROSS-REFERENCE TO RELATED APPLICATION

This application is a divisional of U.S. patent application Ser. No. 17/033,776, filed on Sep. 26, 2020, which claims priority of Chinese Patent Application No. 201911267677.0, filed on Dec. 11, 2019, the entire content of all of which is hereby incorporated by reference.

FIELD OF THE DISCLOSURE

The present disclosure generally relates to the field of semiconductor manufacturing technology and, more particularly, relates to a semiconductor structure and a formation method thereof.

BACKGROUND

A magnetic random access memory (MRAM) is a type of non-volatile random access memory. An MRAM may have a high-speed read and write capability as of a static random access memory (SRAM), a high integration level as of a dynamic random access memory (DRAM), and much lower power consumption than a DRAM. Compared with a flash memory (Flash), performance of an MRAM may not degrade as operation time increases. Due to above characteristics, an MRAM may be called a universal memory, and is expected to replace SRAM, DRAM, Flash, and electrically erasable programmable read-only memory (EEPROM).

Different from a conventional random access memory, data in an MRAM are not stored in a form of electric charge or electric current, but stored in a magnetic state. The data in an MRAM may be sensed by resistance measurement, and the resistance measurement may not interfere with the magnetic state. An MRAM uses a magnetic tunnel junction (MTJ) structure for data storage. Generally, an MRAM cell includes a transistor (1T) and a magnetic tunnel junction (MTJ) structure. The MTJ structure includes at least two electromagnetic layers and an insulation layer for isolating the two electromagnetic layers. Electric current may flow vertically from one electromagnetic layer through the insulation layer, and flow through or "pass" the other electromagnetic layer. One of the electromagnetic layers is a fixed magnetic layer, and dipoles in the electromagnetic layer are fixed in a specific direction by a fixing field. The other electromagnetic layer is a freely rotatable magnetic layer, and dipoles in the electromagnetic layer are held in one direction.

However, performance of magnetic tunnel junctions formed by existing technologies may still need to be improved. The disclosed structures and methods are directed to solve one or more problems set forth above and other problems in the art.

BRIEF SUMMARY OF THE DISCLOSURE

One aspect of the present disclosure includes a method for forming a semiconductor structure. The method includes providing a substrate. The substrate includes a conductive layer inside, and a surface of the substrate exposes a surface of the conductive layer. The method also includes forming a groove adjacent to the conductive layer in the substrate. The groove exposes a portion of a sidewall surface of the conductive layer. The method also includes forming a lower electrode layer in the groove and on a top surface of the conductive layer.

Optionally, a process for forming the groove adjacent to the conductive layer in the substrate includes forming a hard mask structure on the substrate and on the conductive layer, and forming a first patterned layer on the hard mask structure. The first patterned layer includes an opening, and the opening exposes a surface of the hard mask structure on the conductive layer and on a portion of the substrate on a sidewall of the conductive layer. The process also includes, by using the first patterned layer as a mask, etching the hard mask structure and a portion of the substrate to expose the top surface of the conductive layer and the portion of the sidewall surface of the conductive layer, thereby forming the groove. The process also includes, after forming the groove, removing the hard mask structure and the first patterned layer.

Optionally, the method also includes, before forming the groove, forming a stop layer on the substrate and on the conductive layer.

Optionally, the method also includes forming a magnetic tunnel material film on the lower electrode layer. The stop layer and the conductive layer are made of different materials, the stop layer and the substrate are made of different materials, the stop layer and the magnetic tunnel material film are made of different materials, and the stop layer is made of a material including silicon nitride, silicon carbide nitride, silicon oxynitride, or a combination thereof.

Optionally, a surface of the lower electrode layer is flush with a surface of the stop layer. A process for forming the lower electrode layer in the groove and on the top surface of the conductive layer includes forming a lower electrode film in the groove and on the stop layer, and planarizing the lower electrode film until a surface of the stop layer is exposed, thereby forming the lower electrode layer.

Optionally, a process for planarizing the lower electrode film includes a chemical mechanical polishing process or a dry etching process.

Optionally, the method also includes forming a magnetic tunnel material film on the lower electrode layer, and patterning the magnetic tunnel material film, thereby forming a magnetic tunnel junction.

Optionally, a process for patterning the magnetic tunnel material film includes forming a second patterned layer on the magnetic tunnel material film. The second patterned layer covers the magnetic tunnel material film on the lower electrode layer. The process also includes, by using the second patterned layer as a mask, etching the magnetic tunnel material film until a surface of the stop layer is exposed, thereby forming the magnetic tunnel junction.

Optionally, the method also includes, after forming the magnetic tunnel material film and before patterning the magnetic tunnel material film, forming an upper electrode film on the magnetic tunnel material film. The method also includes, by using the second patterned layer as a mask, etching the upper electrode film, thereby forming an upper electrode layer. The upper electrode layer is located on the magnetic tunnel junction.

Optionally, the method also includes, after forming the magnetic tunnel junction, forming a sidewall spacer on a sidewall surface of the magnetic tunnel junction.

Optionally, the method also includes, after forming the magnetic tunnel junction, removing the second patterned layer.

As disclosed, the technical solutions of the present disclosure have the following advantages.

In a semiconductor structure provided by the present disclosure, since a sidewall of the groove expose a portion of a sidewall surface of the conductive layer, the lower electrode layer in the groove may cover the top surface and the portion of the sidewall surface of the conductive layer. Moreover, since the lower electrode layer not only covers the top surface of the conductive layer, but also covers the portion of the sidewall surface of the conductive layer, a contact area between the lower electrode layer and the conductive layer may be increased. Accordingly, contact resistance between a magnetic tunnel junction subsequently formed and the conductive layer may be reduced, and electrical performance of the semiconductor structure formed may thus be improved.

Further, a height of the portion of the sidewall surface of the conductive layer covered by the conductive layer is referred to as a first distance H1, and a height of the conductive layer is referred to as a second distance H2. A ratio of the first distance H1 to the second distance H2 may be in a range of approximately 1/3 to 1/2. The ratio of the first distance H1 to the second distance H2 may affect performance of the semiconductor structure. When the ratio is less than approximately 1/3, the height of the portion of the sidewall surface of the conductive layer covered by the lower electrode layer may be too small. Accordingly, a contact area between the lower electrode layer and the conductive layer may not be effectively increased, and thus performance of the semiconductor structure formed may still be undesirable. When the ratio is greater than approximately 1/2, the height of the portion of the sidewall surface of the conductive layer covered by the lower electrode layer may be too large. Accordingly, a depth of the groove formed by etching the substrate may be too large, that is, the depth and a width of the groove may be too large. As such, a process for forming the groove may be difficult, and the performance of the semiconductor structure formed may be difficult to be improved.

In a method for forming a semiconductor structure provided by the present disclosure, since the groove is formed in the substrate, and the sidewall of the groove exposes a portion of the sidewall surface of the conductive layer, the lower electrode layer formed in the groove may cover the top surface and the portion of the sidewall surface of the conductive layer. Since the lower electrode layer not only covers the top surface of the conductive layer, but also covers the portion of the sidewall surface of the conductive layer, a contact area between the lower electrode layer and the conductive layer may be increased. Accordingly, contact resistance between a magnetic tunnel junction subsequently formed and the conductive layer may be reduced, and electrical performance of the semiconductor structure formed may thus be improved.

Further, a height of the portion of the sidewall surface of the conductive layer covered by the conductive layer is referred to as a first distance H1, and a height of the conductive layer is referred to as a second distance H2. A ratio of the first distance H1 to the second distance H2 may be in a range of approximately 1/3 to 1/2. The ratio of the first distance H1 to the second distance H2 may affect performance of the semiconductor structure. When the ratio is less than approximately 1/3, the height of the portion of the sidewall surface of the conductive layer covered by the lower electrode layer may be too small. Accordingly, a contact area between the lower electrode layer and the conductive layer may not be effectively increased, and thus performance of the semiconductor structure formed may still be undesirable. When the ratio is greater than approximately 1/2, the height of the portion of the sidewall surface of the conductive layer covered by the lower electrode layer may be too large. Accordingly, a depth of the groove formed by etching the substrate may be too large, that is, the depth and a width of the groove may be too large. As such, a process for forming the groove may be difficult, and the performance of the semiconductor structure formed may be difficult to be improved.

Further, the method for forming a semiconductor structure also includes, before the groove is formed, a stop layer is formed on a surface of the substrate and a surface of the conductive layer. Since the planarizing process uses a chemical mechanical polishing process, in a subsequent procedure of planarizing the lower electrode film to form the lower electrode layer, the chemical mechanical polishing process may use the surface of the stop layer as a flat surface. Accordingly, roughness of the lower electrode layer formed may be reduced, and performance of the magnetic tunnel junction formed may be improved. Meanwhile, in a procedure of patterning the magnetic tunnel material film to form the magnetic tunnel junction, an etching process may be stopped on the surface of the stop layer, and thus damages of the etching process to devices in the substrate 200 may be avoided. As such, electrical performance of the semiconductor structure formed may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

Figure 1:
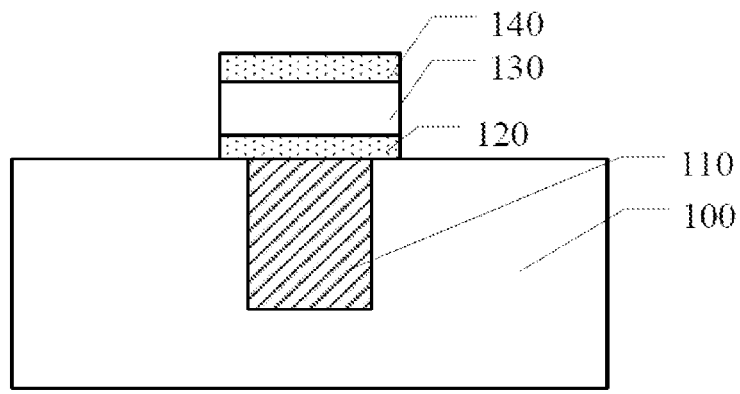
FIG. 1 illustrates a schematic of a semiconductor structure.

FIG. 1 illustrates a schematic of a semiconductor structure. As shown in FIG. 1, the semiconductor structure includes a substrate 100. The substrate 100 includes a conductive layer 110, and the substrate 100 exposes a surface of the conductive layer 110. The semiconductor structure also includes a lower electrode layer 120 on a surface of the conductive layer 110, a magnetic tunnel junction 130 on a surface of the lower electrode layer 120, and an upper electrode layer 140 on a surface of the magnetic tunnel junction 130.

The magnetic tunnel junction 130 is electrically connected to the conductive layer 110 in the substrate 100 through the lower electrode layer 120. With development of semiconductor technology toward an increasingly higher integration level, a feature size of a semiconductor device may be correspondingly reduced, and a size of the conductive layer 110 may also be reduced. Accordingly, a contact area between the lower electrode layer 120 and the conductive layer 110 may be small. As a result, contact resistance between the magnetic tunnel junction 130 and the conductive layer 110 may be large, and thus performance of the semiconductor structure formed may decline.

The present disclosure provides a method for forming a semiconductor structure. The method includes providing a substrate. A conductive layer is formed in the substrate, and a surface of the substrate exposes a surface of the conductive layer. The method also includes forming a groove in the substrate. The groove exposes a top surface and a sidewall surface of the conductive layer. The method also includes forming a lower electrode layer in the groove. The lower electrode layer covers the top surface and the sidewall surface of the conductive layer. The method also includes forming a magnetic tunnel material film on a surface of the lower electrode layer. A semiconductor structure formed by using the method provided by the present disclosure may have improved electric performance.

Figure 11:
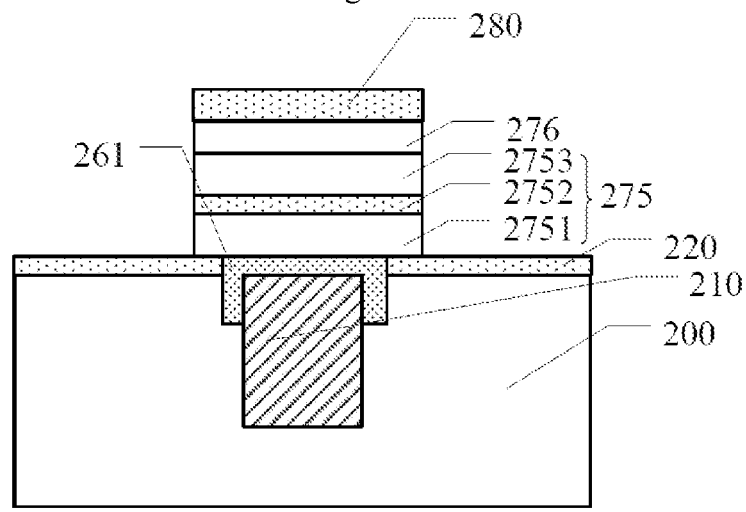
Figure 12:
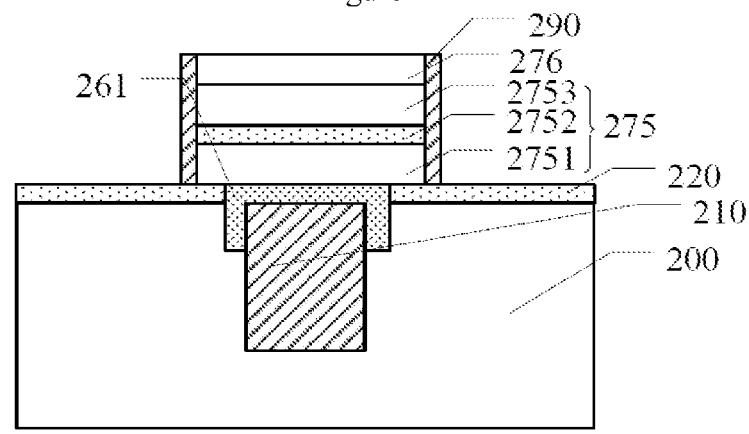
Figure 13:
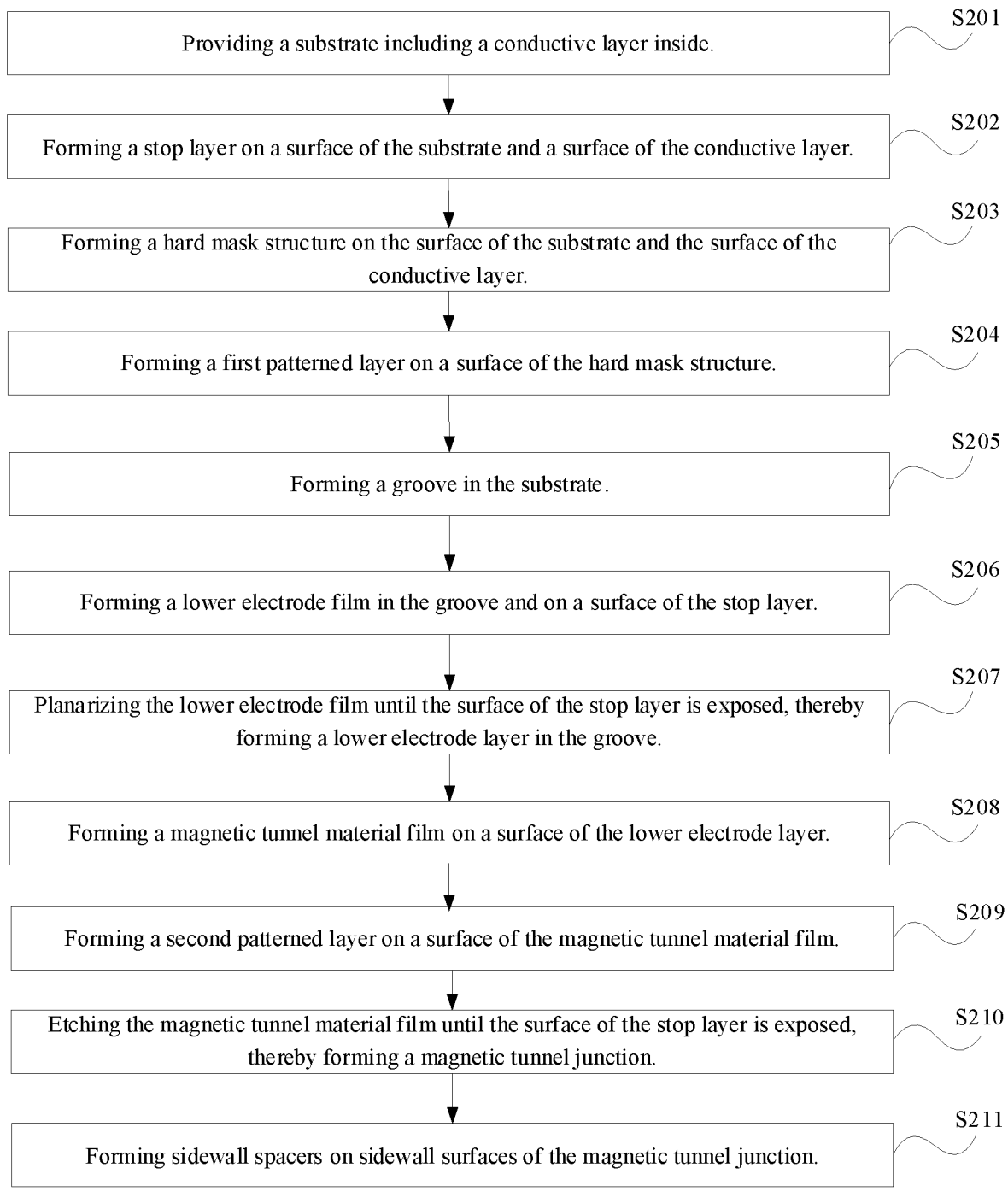
FIG. 13 illustrates an exemplary process of forming a semiconductor structure consistent with the disclosed embodiments of the present disclosure.

FIG. 13 illustrates an exemplary process of forming a semiconductor structure consistent with the disclosed embodiments of the present disclosure. FIGS. 2 to 12 illustrate schematics of semiconductor structures corresponding to certain stages of the exemplary process of forming a semiconductor structure consistent with the disclosed embodiments of the present disclosure.

Figure 2:
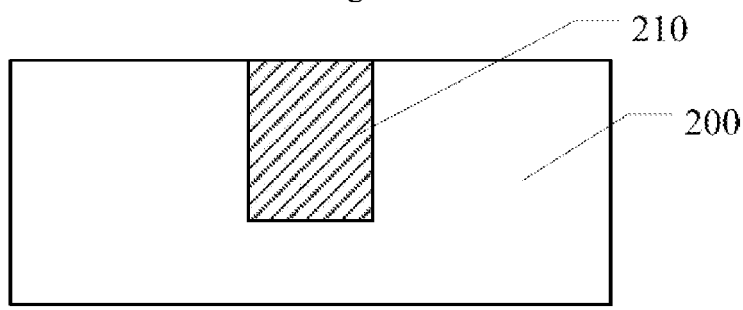
FIGS. 2 to 12 illustrate schematics of semiconductor structures corresponding to certain stages of an exemplary process of forming a semiconductor structure consistent with the disclosed embodiments of the present disclosure.

As shown in FIG. 13, at the beginning of the forming process, a substrate is provided (S201). FIG. 2 illustrates a corresponding semiconductor structure.

As shown in FIG. 2, a substrate 200 is provided. The substrate 200 includes a conductive layer 210 inside, and a surface of the substrate 200 exposes a surface of the conductive layer 210.

In one embodiment, the substrate 200 includes a base (not shown in FIG. 2) and a dielectric layer (not shown in FIG. 2) on a surface of the base. The conductive layer 210 is located in the dielectric layer.

The base is made of a semiconductor material. In one embodiment, the base is made of silicon. In some other embodiments, the base may be made of a material including silicon carbide, silicon germanium, multi-element semiconductor materials composed of group III-V elements, silicon-on-insulator (SOI), germanium-on-insulator, or a combination thereof.

In one embodiment, the base includes a device structure (not shown in FIG. 2). The device structure may include one or more of PMOS transistors, NMOS transistors, CMOS transistors, resistors, capacitors, and inductors.

The dielectric layer may be made of a material including silicon oxide, low-K dielectric material, ultra-low-K dielectric material, or a combination thereof. In one embodiment, the dielectric layer is made of silicon oxide.

The conductive layer 210 may be made of a material including copper, tungsten, aluminum, titanium, titanium nitride, tantalum, or a combination thereof. In one embodiment, the conductive layer 210 is made of copper.

Figure 3:
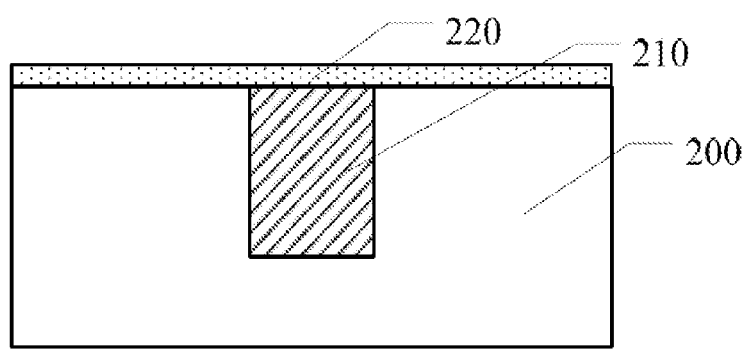

Returning to FIG. 13, after the substrate 200 is provided, a stop layer may be formed on the surface of the substrate and the surface of the conductive layer (S202). FIG. 3 illustrates a corresponding semiconductor structure.

Referring to FIG. 3, a stop layer 220 is formed on the surface of the substrate 200 and the surface of the conductive layer 210. The stop layer 220 may have following functions. On one hand, the stop layer 220 may be used as a flat layer in a subsequent process of planarizing a lower electrode film and thus forming a lower electrode layer in the groove. On the other hand, the stop layer 220 may be used as a stop layer in a subsequent process of patterning a magnetic tunnel material film and thus forming a magnetic tunnel junction. Accordingly, the stop layer 220 may reduce influence of the process of patterning on devices in the substrate 200.

The stop layer 220 and the conductive layer 210 are made of different materials. The stop layer 220 and the substrate 200 are made of different materials. The stop layer 220 and a magnetic tunnel material film subsequently formed are made of different materials.

The stop layer 220 may be made of a material including silicon nitride, silicon carbide nitride, silicon oxynitride, or a combination thereof. In one embodiment, the stop layer 220 is made of silicon carbide nitride.

In some other embodiments, the stop layer may not be formed.

Figure 5:
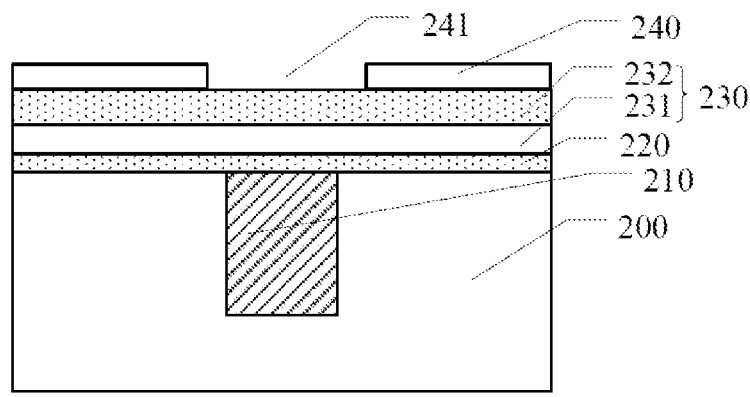
Figure 6:
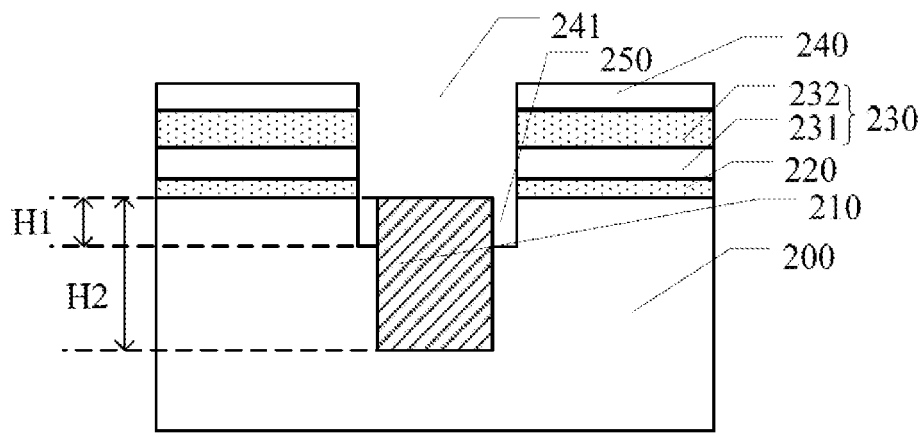

Subsequently, a groove adjacent to the conductive layer may be formed in the substrate. The groove may expose a sidewall surface of the conductive layer. A process of forming the groove are illustrated by FIG. 4 to FIG. 6.

Returning to FIG. 13, after the stop layer is formed, a hard mask structure may be formed on the surface of the substrate and the surface of the conductive layer (S203). FIG. 4 illustrates a corresponding semiconductor structure.

Figure 4:
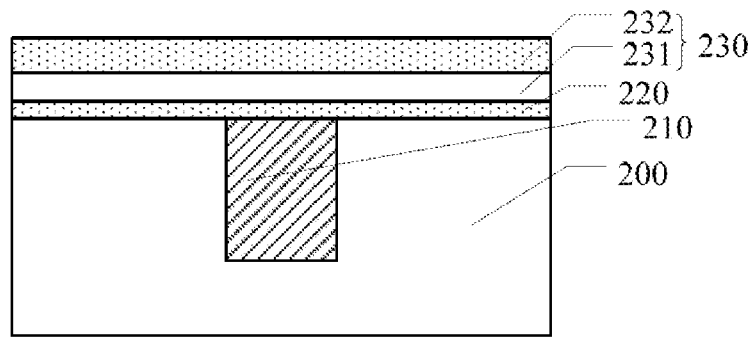

Referring to FIG. 4, a hard mask structure 230 is formed on the surface of the substrate 200 and the surface of the conductive layer 210. With the hard mask structure 230, stability and accuracy of pattern transfer may be improved.

In one embodiment, the hard mask structure 230 is formed on a surface of the stop layer 220.

In one embodiment, the hard mask structure 230 is a multilayer structure. The hard mask structure 230 includes a first hard mask layer 231 on the surface of the stop layer 220, and a second hard mask layer 232 on a surface of the first hard mask layer 231.

In one embodiment, the first hard mask layer 231 is made of nitrogen-doped silicon oxycarbide. The first hard mask layer 231 made of nitrogen-doped silicon oxycarbide may have a good bonding ability with the substrate 200. In a subsequent process of etching the substrate 200 by using the etched first hard mask layer 231 as a mask, the first hard mask layer 231 may not peel or warp. Accordingly, the first hard mask layer 231 may have a good ability of keeping an etching pattern, and accuracy of pattern transfer may thus be improved.

The second hard mask layer 232 is made of titanium nitride. Due to a good bonding ability between the second hard mask layer 232 and the first hard mask layer 231, the second hard mask layer 232 may protect the surface of the first hard mask layer 231 in a subsequent etching process, such that the first hard mask layer 231 may not be thinned. Moreover, the second hard mask layer 232 may have a high physical strength. Accordingly, in a subsequent etching process, patterns of the second hard mask layer 232 and the first hard mask layer 231 may be kept stable, and thus the accuracy of pattern transfer may be further improved.

In some other embodiments, the hard mask structure may also be a single-layer structure.

Returning to FIG. 13, after the hard mask structure is formed, a first patterned layer may be formed on a surface of the hard mask structure (S204). FIG. 5 illustrates a corresponding semiconductor structure.

Referring to FIG. 5, a first patterned layer 240 is formed on a surface of the hard mask structure 230. The first patterned layer 240 includes an opening 241. The opening 241 exposes the surface of the hard mask structure 230 on the conductive layer 210 and on a portion of the substrate 200 on the sidewall of the conductive layer 210.

The first patterned layer 240 may be used as a mask for subsequently etching the substrate 200. The opening 241 may be used to subsequently define a position and size of the groove to be formed.

In one embodiment, the opening 241 not only exposes the surface of the hard mask structure 230 on the conductive layer 210, but also exposes the surface of the hard mask structure 230 on a portion of the substrate 200 on two sides of the conductive layer 210.

In one embodiment, the opening 241 not only exposes the surface of the hard mask structure 230 on the conductive layer 210, but also exposes the surface of the hard mask structure 230 on a portion of the substrate 200 on two sides of the conductive layer 210. Accordingly, a projection pattern of the conductive layer 210 on the surface of the substrate 200 is within a projection pattern of a groove to be formed subsequently on the surface of the substrate 200.

In some other embodiments, the opening exposes the surface of the hard mask structure on the conductive layer, and also exposes a surface of a portion of the hard mask structure on one side of the conductive layer.

Returning to FIG. 13, after the first patterned layer is formed, a groove may be formed in the substrate (S205). FIG. 6 illustrates a corresponding semiconductor structure.

Referring to FIG. 6, by using the first patterned layer 240 as a mask, the hard mask structure 230 and a portion of the substrate 200 are etched. The top surface of the conductive layer 210 and a portion of the sidewall surface of the conductive layer 210 are exposed, thereby forming a groove 250 in the substrate 200. In a subsequent process, the groove 250 may be filled with a material to form a lower electrode layer.

It should be noted that, in one embodiment, the groove 250 is located in the substrate 200 and the stop layer 220.

In one embodiment, the groove 250 exposes the top surface of the conductive layer 210 and a portion of the sidewall surface on two sides of the conductive layer 210. That is, a projection pattern of the conductive layer 210 on the surface of the substrate 200 is within a projection pattern of the groove 250 on the surface of the substrate 200.

A distance from a bottom of the groove 250 to the top of the conductive layer 210 is a first distance H1. A distance from a bottom of the conductive layer 210 to the top of the conductive layer 210 is a second distance H2. A ratio of the first distance H1 to the second distance H2 is in a range of approximately 1/3 to 1/2.

A process of etching the hard mask structure 230 and a portion of the substrate 200 includes a process of a dry etching process, a wet etching process, or a combination thereof. In one embodiment, the process of etching the hard mask structure 230 and a portion of the substrate 200 includes an anisotropic dry etching process.

In one embodiment, after forming the groove 250, the method also includes removing the hard mask structure 230 and the first patterned layer 240.

Subsequently, a lower electrode layer may be formed in the groove, and the lower electrode layer may cover the top surface and a portion of the sidewall surface of the conductive layer.

Figure 7:
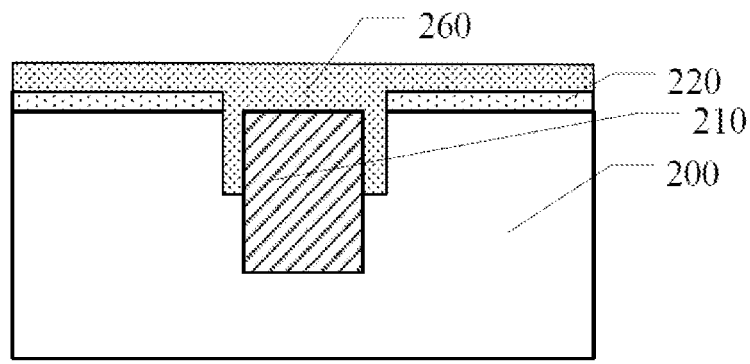
Figure 8:
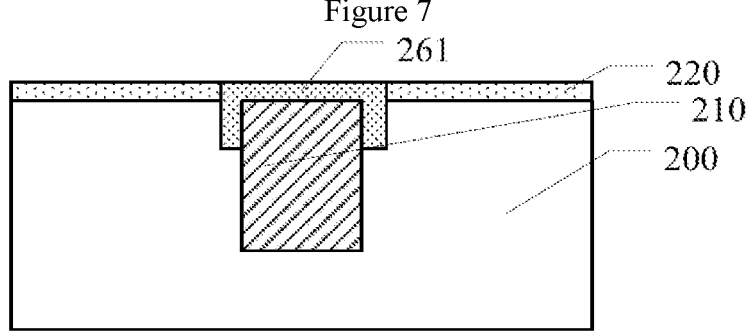

In one embodiment, a surface of the lower electrode layer is flush with the surface of the stop layer. FIGS. 7 to 8 illustrate a process of forming the lower electrode layer.

Returning to FIG. 13, after the groove is formed, a lower electrode film may be formed in the groove and on the surface of the stop layer (S206). FIG. 7 illustrates a corresponding semiconductor structure.

Referring to FIG. 7, a lower electrode film 260 is formed in the groove 250 and on the surface of the stop layer 220. The lower electrode film 260 may be used to provide a material for subsequent formation of a lower electrode layer.

The lower electrode film 260 is made of a material including copper, tungsten, aluminum, titanium, titanium nitride, tantalum, or a combination thereof. In one embodiment, the lower electrode film 260 is made of tantalum.

Returning to FIG. 13, after the lower electrode film is formed, the lower electrode film may be planarized until the surface of the stop layer is exposed, thereby forming a lower electrode layer in the groove (S207). FIG. 8 illustrates a corresponding semiconductor structure.

Referring to FIG. 8, the lower electrode film 260 is planarized until the surface of the stop layer 220 is exposed, thereby forming a lower electrode layer 261 in the groove 250. In one embodiment, a surface of the lower electrode layer 261 is flush with the surface of the stop layer 220.

A process of planarizing the lower electrode film 260 includes a chemical mechanical polishing process or a dry etching process.

Since a sidewall of the groove 250 expose a portion of the sidewall surface of the conductive layer 210, the lower electrode layer 261 formed in the groove 250 may not only cover the top surface of the conductive layer 210, but also cover the portion of the sidewall surface of the conductive layer 210.

Since the lower electrode layer 261 is formed by planarizing the lower electrode film 260, the lower electrode layer 261 may be made of a material including copper, tungsten, aluminum, titanium, titanium nitride, tantalum, or a combination thereof. In one embodiment, the lower electrode layer 261 is made of tantalum.

In one embodiment, the lower electrode layer 261 covers the top surface of the conductive layer 210 and a portion of the sidewall surface on two sides of the conductive layer 210.

Since the groove 250 is formed in the substrate 200, and the sidewall of the groove 250 exposes a portion of the sidewall surface of the conductive layer 210, the lower electrode layer 261 formed in the groove 250 may cover the top surface and the portion of the sidewall surface of the conductive layer 210. Since the lower electrode layer 261 not only covers the top surface of the conductive layer 210, but also covers the portion of the sidewall surface of the conductive layer 210, a contact area between the lower electrode layer 261 and the conductive layer 210 may be increased. Accordingly, contact resistance between a magnetic tunnel junction subsequently formed and the conductive layer 210 may be reduced, and electrical performance of the semiconductor structure formed may thus be improved.

In one embodiment, a process of planarizing the lower electrode film 260 is a chemical mechanical polishing process.

In one embodiment, the stop layer 220 is formed on the surface of the substrate 200, and the planarizing process uses a chemical mechanical polishing process. In a process of planarizing the lower electrode film 260 and thus forming the lower electrode layer 261, the chemical mechanical polishing process may use the surface of the stop layer 220 as a flat surface. Accordingly, roughness of the lower electrode layer 261 formed may be reduced, and performance of a magnetic tunnel junction formed may be improved.

Figure 9:
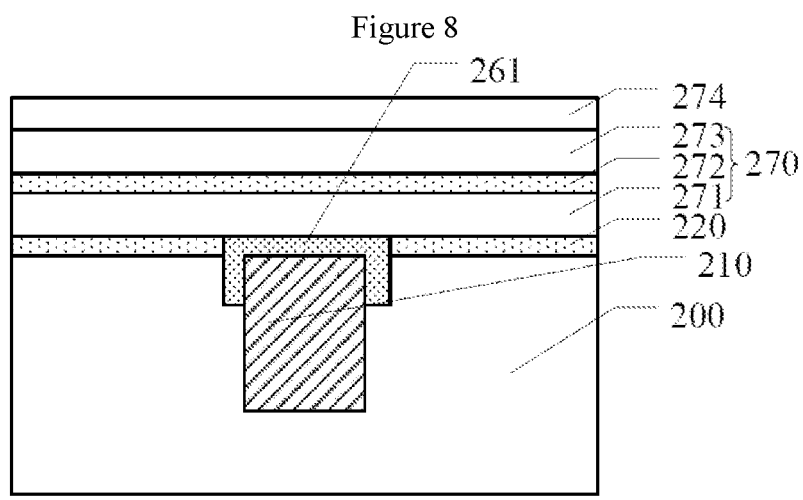

Returning to FIG. 13, after the lower electrode layer is formed, a magnetic tunnel material film may be formed on the surface of the lower electrode layer (S208). FIG. 9 illustrates a corresponding semiconductor structure.

Referring to FIG. 9, a magnetic tunnel material film 270 is formed on the surface of the lower electrode layer 261. In one embodiment, the magnetic tunnel material film 270 is formed on the surface of the lower electrode layer 261 and the surface of the stop layer 220. The magnetic tunnel material film 270 may be used to subsequently form a magnetic tunnel junction.

A process of forming the magnetic tunnel material film 270 includes forming a lower electromagnetic material film 271 on the surface of the substrate 200 and the surface of the lower electrode layer 261, forming an insulation film 272 on a surface of the lower electromagnetic material film 271, and forming an upper electromagnetic material film 273 on a surface of the insulation film 272.

The lower electromagnetic material film 271 includes a lower composite film (not shown in FIG. 9) on the surface of the substrate 200 and the surface of the lower electrode layer 261, and a lower electromagnetic film (not shown in FIG. 9) on a surface of the lower composite film. In one embodiment, the lower composite film is located on the surface of the stop layer 220 and the surface of the lower electrode layer 261.

The lower electromagnetic film may be made of a material including iron, platinum, cobalt, nickel, cobalt iron boron, cobalt iron, nickel iron, lanthanum strontium manganese oxide, or a combination thereof.

The lower composite film may be a single-layer structure or a composite structure. When the lower composite film is a single-layer structure, the lower composite film may be made of a material including iron, platinum, cobalt, nickel, cobalt iron boron, cobalt iron, nickel iron, lanthanum strontium manganese oxide, or a combination thereof. When the lower composite film is a composite structure, the lower composite film may include a plurality of overlapping conductive layers. Each layer of the plurality of overlapping conductive layers may be made of a material including iron, platinum, cobalt, nickel, cobalt iron boron, cobalt iron, nickel iron, lanthanum strontium manganese oxide, or a combination thereof.

In one embodiment, the lower electromagnetic film is a single-layer structure, and the lower electromagnetic film is made of cobalt iron boron. The lower composite film is a double-layer structure. The lower composite film includes a conductive layer made of a cobalt material and a conductive layer made of a platinum material. Accordingly, the lower electromagnetic material film 271 is a fixed layer, that is, a magnetization direction of the lower electromagnetic material film 271 is fixed.

The upper electromagnetic material film 273 includes an upper composite film (not shown in FIG. 9) on a surface of the insulation film 272, and an upper electromagnetic film (not shown in FIG. 9) on a surface of the upper composite film.

The upper electromagnetic film may be made of a material including iron, platinum, cobalt, nickel, cobalt iron boron, cobalt iron, nickel iron, lanthanum strontium manganese oxide, or a combination thereof.

The upper composite film may be a single-layer structure or a composite structure. When the upper composite film is a single-layer structure, the upper composite film may be made of a material including iron, platinum, cobalt, nickel, cobalt iron boron, cobalt iron, nickel iron, lanthanum strontium manganese oxide, or a combination thereof. When the upper composite film is a composite structure, the upper composite film includes a plurality of overlapping conductive layers. Each layer of the plurality of overlapping conductive layers may be made of a material including iron, platinum, cobalt, nickel, cobalt iron boron, cobalt iron, nickel iron, lanthanum strontium manganese oxide, or a combination thereof.

In one embodiment, the upper electromagnetic film is a single-layer structure, and the upper electromagnetic film is made of cobalt-iron-boron. The upper composite film includes a double-layer structure. The upper composite film includes a conductive layer made of a cobalt material and a conductive layer made of a nickel material. Accordingly, the upper electromagnetic material film 273 is a free layer, that is, a magnetization direction of the upper electromagnetic material film 271 is not fixed.

The insulation film 272 is made of a material including magnesium oxide, aluminum oxide, silicon nitride, silicon oxynitride, hafnium dioxide, zirconium dioxide, or a combination thereof. In one embodiment, the insulation film 272 is a single-layer structure, and the insulation film 272 is made of magnesium oxide.

In one embodiment, the method also includes forming an upper electrode film 274 on a surface of the magnetic tunnel material film 270. The upper electrode film 274 is made of a material including copper, tungsten, aluminum, titanium, titanium nitride, tantalum, or a combination thereof. In one embodiment, the upper electrode film 274 has a single-layer structure, and the upper electrode film is made of tantalum.

Figure 10:
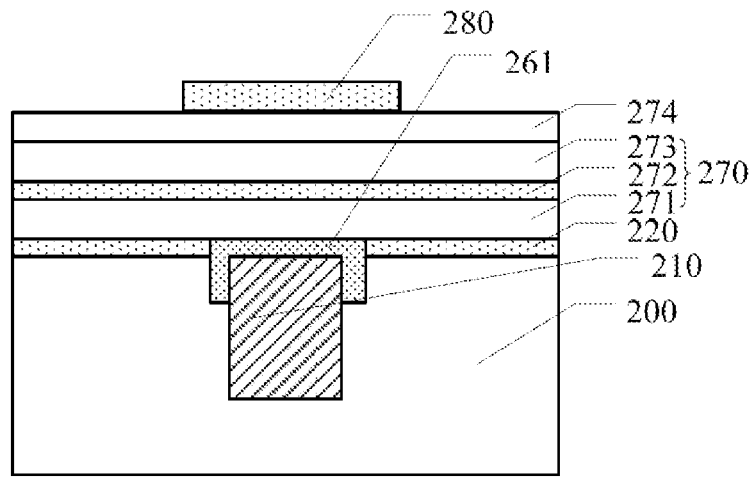

Subsequently, the magnetic tunnel material film is patterned, and a magnetic tunnel junction is thus formed. FIGS. 10 to 11 illustrate a process of forming the magnetic tunnel junction.

Returning to FIG. 13, after the magnetic tunnel material film is formed, a second patterned layer may be formed on a surface of the magnetic tunnel material film (S209). FIG. 10 illustrates a corresponding semiconductor structure.

Referring to FIG. 10, a second patterned layer 280 is formed on a surface of the magnetic tunnel material film 270. The second patterned layer 280 covers the surface of the magnetic tunnel material film 270 on the lower electrode layer 261. In one embodiment, the second patterned layer 280 is formed on a surface of the upper electrode film 274 on the surface of the magnetic tunnel material film 270.

The second patterned layer 280 may be used to define a size and position of a magnetic tunnel junction to be formed subsequently.

In one embodiment, the second patterned layer 280 not only covers a surface of a portion of the upper electrode film 274 on the lower electrode layer 261, but also covers a surface of a portion of the upper electrode film 274 on the portion of the substrate 200 on two sides of the lower electrode layer 261.

Returning to FIG. 13, after the second patterned layer is formed, the magnetic tunnel material film may be etched until the surface of the stop layer is exposed, thereby forming a magnetic tunnel junction (S210). FIG. 11 illustrates a corresponding semiconductor structure.

Referring to FIG. 11, by using the second patterned layer 280 as a mask, the magnetic tunnel material film 270 is etched until the surface of the stop layer 220 is exposed, thereby forming a magnetic tunnel junction 275.

Since the stop layer 220 is disposed on the surface of the substrate 200, in a process of patterning the magnetic tunnel material film 270 to form the magnetic tunnel junction 275, an etching process may be stopped on the surface of the stop layer 220. Accordingly, damages of the etching process to devices in the substrate 200 may be avoided, and electrical performance of the semiconductor structure formed may thus be improved.

By patterning the magnetic tunnel material film 270, the lower electromagnetic material film 271 may form a lower electromagnetic layer 2751, the insulation film 272 may form an insulation layer 2752, and the upper electromagnetic material film 272 may form an upper electromagnetic layer 2753. Correspondingly, the magnetic tunnel junction 275 includes the lower electromagnetic layer 2751 on the surface of the lower electrode layer 261, the insulation layer 2752 on a surface of the lower electromagnetic layer 2751, and the upper electromagnetic layer 2753 on a surface of the insulation layer 2752.

In one embodiment, the method for forming the semiconductor structure further includes, by using the second patterned layer 280 as a mask, etching the upper electrode film 274 to form an upper electrode layer 276. The upper electrode layer 276 is located on a surface of the magnetic tunnel junction 275.

In one embodiment, after forming the magnetic tunnel junction 275, the method also includes removing the second patterned layer 280.

Returning to FIG. 13, after the magnetic tunnel junction is formed, sidewall spacers may be formed on sidewall surfaces of the magnetic tunnel junction (S211). FIG. 12 illustrates a corresponding semiconductor structure.

Referring to FIG. 12, after the magnetic tunnel junction 275 is formed, sidewall spacers 290 are formed on sidewall surfaces of the magnetic tunnel junction 275. In one embodiment, the sidewall spacers 290 are formed on the sidewall surfaces of the magnetic tunnel junction 275 and sidewall surfaces of the upper electrode layer 276.

A process for forming the sidewall spacers 290 includes forming a sidewall spacer material film (not shown in FIG. 12) on the surface of the substrate 200, the sidewall surfaces of the magnetic tunnel junction 275, and the top surface and sidewall surfaces of the upper electrode layer 276. The process for forming the sidewall spacers 290 also includes etching back the sidewall spacer material film until the surface of the substrate 200 and the top surface of the upper electrode layer 276 are exposed, thereby forming the sidewall spacers 290.

The present disclosure also provides a semiconductor structure. Referring to FIG. 9, the semiconductor structure includes a substrate 200. The substrate 200 includes a conductive layer 210 inside, and a surface of the substrate 200 exposes a surface of the conductive layer 210. The semiconductor structure also includes a groove 250 located in the substrate 200 and adjacent to the conductive layer 210. A sidewall of the groove 250 exposes a portion of a sidewall surface of the conductive layer 210. The semiconductor structure also includes a lower electrode layer 261 located in the groove 250 and on a top surface of the conductive layer 210, and a magnetic tunnel material film 270 located on a surface of the lower electrode layer 261.

Since the lower electrode layer 261 not only covers the top surface of the conductive layer 210, but also covers the portion of the sidewall surface of the conductive layer 210, a contact area between the lower electrode layer 261 and the conductive layer 210 may be increased. Accordingly, contact resistance between a magnetic tunnel junction subsequently formed and the conductive layer 210 may be reduced, and electrical performance of the semiconductor structure formed may thus be improved.

In one embodiment, a distance from a bottom of the groove 250 (as shown in FIG. 6) to a top of the conductive layer 210 is a first distance H1 (as shown in FIG. 6). A distance from a bottom of the conductive layer 210 to the top of the conductive layer 210 is a second distance H2 (as shown in FIG. 6). A ratio of the first distance H1 to the second distance H2 may be in a range of approximately 1/3 to 1/2.

The ratio of the first distance H1 to the second distance H2 may affect performance of the semiconductor structure. When the ratio is less than approximately 1/3, a height of the portion of the sidewall surface of the conductive layer 210 covered by the lower electrode layer 261 may be too small. Accordingly, a contact area between the lower electrode layer 261 and the conductive layer 210 may not be effectively increased, and thus performance of the semiconductor structure formed may still be undesirable. When the ratio is greater than approximately 1/2, the height of the portion of the sidewall surface of the conductive layer 210 covered by the lower electrode layer 261 may be too large. Accordingly, a depth of the groove 250 formed by etching the substrate 200 may be too large, that is, the depth and a width of the groove 250 may be too large. As such, a process for forming the groove 250 may be difficult, and the performance of the semiconductor structure formed may be difficult to be improved.

The lower electrode layer 261 may be made of a material including copper, tungsten, aluminum, titanium, titanium nitride, tantalum, or a combination thereof.

The magnetic tunnel material film 270 includes a lower electromagnetic material film 271 on the surface of the substrate 200 and on a surface of the lower electrode layer 261, an insulation film 272 on a surface of the lower electromagnetic material film 271, and an upper electromagnetic material film 273 on a surface of the insulation film 272.

The insulation film 272 may be made of a material including magnesium oxide, aluminum oxide, silicon nitride, silicon oxynitride, hafnium dioxide, zirconium dioxide, or a combination thereof.

The lower electromagnetic material film 271 includes a lower composite film (not shown in FIG. 9) on the surface of the substrate 200 and on the surface of the lower electrode film 261, and a lower electromagnetic film (not shown in FIG. 9) on a surface of the lower composite film. The upper electromagnetic material film 273 includes an upper composite film (not shown in FIG. 9) on a surface of the insulation film 272 and an upper electromagnetic film (not shown in FIG. 9) on a surface of the upper composite film.

The upper electromagnetic film may be made of a material including iron, platinum, cobalt, nickel, cobalt iron boron, cobalt iron, nickel iron, lanthanum strontium manganese oxide, or a combination thereof. The lower electromagnetic film may be made of a material including iron, platinum, cobalt, nickel, cobalt iron boron, cobalt iron, nickel iron, lanthanum strontium manganese oxide, or a combination thereof.

The upper composite film may be a single-layer structure or a composite structure. When the upper composite film is a single-layer structure, the upper composite film may be made of a material including iron, platinum, cobalt, nickel, cobalt iron boron, cobalt iron, nickel iron, lanthanum strontium manganese oxide, or a combination thereof. When the upper composite film is a composite structure, the upper composite film includes a plurality of overlapping conductive layers. Each layer of the plurality of overlapping conductive layers may be made of a material including iron, platinum, cobalt, nickel, cobalt iron boron, cobalt iron, nickel iron, lanthanum strontium manganese oxide, or a combination thereof.

The lower composite film may be a single-layer structure or a composite structure. When the lower composite film is a single-layer structure, the lower composite film may be made of a material including iron, platinum, cobalt, nickel, cobalt iron boron, cobalt iron, nickel iron, lanthanum strontium manganese oxide, or a combination thereof. When the lower composite film is a composite structure, the lower composite film may include a plurality of overlapping conductive layers. Each layer of the plurality of overlapping conductive layers may be made of a material including iron, platinum, cobalt, nickel, cobalt iron boron, cobalt iron, nickel iron, lanthanum strontium manganese oxide, or a combination thereof.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method for forming a semiconductor structure, comprising:
   providing a substrate, wherein the substrate includes a conductive layer therein, and a surface of the substrate exposes a surface of the conductive layer;
   forming a groove adjacent to the conductive layer in the substrate, wherein the groove exposes a portion of a sidewall surface of the conductive layer, and forming the groove adjacent to the conductive layer in the substrate includes:
     forming a hard mask structure on the substrate and on the conductive layer;
     forming a first patterned layer on the hard mask structure, wherein the first patterned layer includes an opening, and the opening exposes a surface of the hard mask structure on the conductive layer and on a portion of the substrate on a sidewall of the conductive layer;
     by using the first patterned layer as a mask, etching the hard mask structure and a portion of the substrate to expose the top surface of the conductive layer and the portion of the sidewall surface of the conductive layer, thereby forming the groove; and
     after forming the groove, removing the hard mask structure and the first patterned layer; and
   forming a lower electrode layer in the groove and on a top surface of the conductive layer.

2. The method according to claim 1, further comprising:
   before forming the groove, forming a stop layer on the substrate and on the conductive layer.

3. The method according to claim 2, further comprising forming a magnetic tunnel material film on the lower electrode layer, wherein:
   the stop layer and the conductive layer are made of different materials;
   the stop layer and the substrate are made of different materials;
   the stop layer and the magnetic tunnel material film are made of different materials; and
   the stop layer is made of a material including silicon nitride, silicon carbide nitride, silicon oxynitride, or a combination thereof.

4. The method according to claim 3, wherein:
   a surface of the lower electrode layer is flush with a surface of the stop layer; and
   forming the lower electrode layer in the groove and on the top surface of the conductive layer comprises:
   forming a lower electrode film in the groove and on the stop layer; and
   planarizing the lower electrode film until a surface of the stop layer is exposed, thereby forming the lower electrode layer.

5. The method according to claim 4, wherein:
   planarizing the lower electrode film includes a chemical mechanical polishing process or a dry etching process.

6. The method according to claim 1, further comprising:
   forming a magnetic tunnel material film on the lower electrode layer; and
   patterning the magnetic tunnel material film, thereby forming a magnetic tunnel junction.

7. The method according to claim 6, wherein patterning the magnetic tunnel material film comprises:
   forming a second patterned layer on the magnetic tunnel material film, wherein the second patterned layer covers the magnetic tunnel material film on the lower electrode layer; and
   by using the second patterned layer as a mask, etching the magnetic tunnel material film until a surface of the stop layer is exposed, thereby forming the magnetic tunnel junction.

8. The method according to claim 7, further comprising:
   after forming the magnetic tunnel material film and before patterning the magnetic tunnel material film, forming an upper electrode film on the magnetic tunnel material film; and
   by using the second patterned layer as a mask, etching the upper electrode film, thereby forming an upper electrode layer, wherein the upper electrode layer is located on the magnetic tunnel junction.

9. The method according to claim 8, further comprising:
   after forming the magnetic tunnel junction, forming a sidewall spacer on a sidewall surface of the magnetic tunnel junction.

10. The method according to claim 9, further comprising:
    after forming the magnetic tunnel junction, removing the second patterned layer.

11. The method according to claim 1, wherein:
    the portion of the sidewall surface of the conductive layer is a first portion; and
    a second portion of the sidewall surface of the conductive layer is in contact with the substrate.

12. The method according to claim 1, wherein:
    a distance from a bottom of the groove to a top of the conductive layer is a first distance;
    a distance from a bottom of the conductive layer to the top of the conductive layer is a second distance; and
    a ratio of the first distance over the second distance is in a range of approximately 1/3 to 1/2.

13. A method for forming a semiconductor structure, comprising:
    providing a substrate, wherein the substrate includes a conductive layer therein, and a surface of the substrate exposes a surface of the conductive layer;

forming a groove adjacent to the conductive layer in the substrate, wherein the groove exposes a portion of a sidewall surface of the conductive layer;

forming a lower electrode layer in the groove and on a top surface of the conductive layer;

forming a magnetic tunnel material film on the lower electrode layer; and patterning the magnetic tunnel material film to form a magnetic tunnel junction.

14. A method for forming a semiconductor structure, comprising:

providing a substrate, wherein the substrate includes a conductive layer therein, and a surface of the substrate exposes a surface of the conductive layer;

forming a groove adjacent to the conductive layer in the substrate, wherein the groove exposes a first portion of a sidewall surface of the conductive layer, and a second portion of the sidewall surface of the conductive layer is in contact with the substrate; and forming a lower electrode layer in the groove and on a top surface of the conductive layer.

\* \* \* \* \*